(12) United States Patent
Noorlag

(10) Patent No.: US 8,912,584 B2
(45) Date of Patent: Dec. 16, 2014

(54) PFET POLYSILICON LAYER WITH N-TYPE END CAP FOR ELECTRICAL SHUNT

(71) Applicant: Apple Inc., Cupertino, CA (US)

(72) Inventor: Date Jan Willem Noorlag, Seongnam-si (KR)

(73) Assignee: Apple Inc., Cupertino, CA (US)

( * ) Notice: Subject to any disclaimer, the term of this patent is extended or adjusted under 35 U.S.C. 154(b) by 70 days.

(21) Appl. No.: 13/658,049

(22) Filed: Oct. 23, 2012

(65) Prior Publication Data

US 2014/0110792 A1    Apr. 24, 2014

(51) Int. Cl.
H01L 27/146    (2006.01)

(52) U.S. Cl.
USPC ............. 257/292; 257/E21.375; 257/E29.309

(58) Field of Classification Search
CPC ............ H01L 27/14603; H01L 27/115; H01L 21/823842
USPC ............................ 257/E21.375, E29.309, 292
See application file for complete search history.

(56) References Cited

U.S. PATENT DOCUMENTS

| | | | |
|---|---|---|---|
| 4,894,702 A | 1/1990 | Maas et al. | |
| 5,990,520 A | 11/1999 | Noorlag et al. | |
| 6,768,149 B1 * | 7/2004 | Mann et al. | 257/292 |
| 7,176,519 B2 | 2/2007 | Schuler | |
| 7,675,097 B2 * | 3/2010 | Adkisson et al. | 257/292 |
| 8,026,539 B2 * | 9/2011 | Hargrove et al. | 257/288 |
| 8,218,380 B2 | 7/2012 | Noorlag | |
| 8,227,844 B2 * | 7/2012 | Adkisson et al. | 257/292 |
| 8,248,095 B2 | 8/2012 | Noorlag et al. | |
| 8,299,825 B2 | 10/2012 | Noorlag et al. | |
| 2008/0048266 A1 * | 2/2008 | Russ et al. | 257/355 |
| 2008/0311710 A1 * | 12/2008 | Herner et al. | 438/166 |
| 2010/0187610 A1 * | 7/2010 | Kwon et al. | 257/369 |
| 2011/0095357 A1 | 4/2011 | Hu | |
| 2011/0101990 A1 | 5/2011 | Noorlag et al. | |
| 2011/0102064 A1 | 5/2011 | Noorlag et al. | |
| 2011/0210403 A1 | 9/2011 | Teo et al. | |
| 2011/0223727 A1 | 9/2011 | Ko et al. | |
| 2011/0228603 A1 | 9/2011 | Takashima | |
| 2012/0056250 A1 | 3/2012 | Snyder et al. | |

OTHER PUBLICATIONS

U.S. Appl. No. 13/613,531, filed Sep. 13, 2012, inventor Noorlag.

* cited by examiner

*Primary Examiner* — John C Ingham
(74) *Attorney, Agent, or Firm* — Gareth M. Sampson; Meyertons, Hood, Kivlin, Kowert & Goetzel, P.C.

(57) ABSTRACT

A semiconductor device includes a PFET transistor (a PMOS FET) having a poly(silicon) layer with a p-type doped portion and an n-type doped portion. The p-type doped portion is located above a channel region of the transistor and the n-type doped portion is located in an end portion of the poly layer outside the channel region. The poly layer may be formed by doping portions of an amorphous silicon layer with either the p-type dopant or the n-type dopant and then annealing the amorphous silicon layer to diffuse the dopants and crystallize the amorphous silicon to form polysilicon. The n-type doped portion of the poly layer may provide an electrical shunt in the end portion of the poly layer to reduce any effects of insufficient diffusion of the p-type dopant in the poly layer.

26 Claims, 4 Drawing Sheets

US 8,912,584 B2

PFET POLYSILICON LAYER WITH N-TYPE END CAP FOR ELECTRICAL SHUNT

BACKGROUND

1. Field of the Invention

The present invention relates to semiconductor devices and methods for forming semiconductor devices such as field effect transistors. More particularly, the invention relates to forming doped polysilicon layers in gates of field effect transistors.

2. Description of Related Art

High-k (dielectric constant) dielectric materials have been used to replace silicon oxide/nitride as the gate dielectric in MOSFET (metal-oxide-semiconductor field-effect transistor) devices as the size of MOSFET devices continually becomes smaller and smaller. The high dielectric constant of the high-k dielectric material allows increased gate capacitance while inhibiting leakage due to tunneling. New issues and/or problems arise as the designs of structures using high-k dielectric materials, the processes for forming such structures (e.g., gate layer formation during gate first high-k metal gate (HKMG) processes), and the uses of such structures continue to change. Thus, there is continuing development of new solutions to overcome some of these issues and/or problems.

One issue that may arise in certain MOSFET devices (e.g., PFETs (PMOS field effect transistors)) formed using HKMG processes is the presence of high gate series resistances at one or more interfaces in the device. The high gate series resistance (e.g., on the order of MΩ, 10 MΩ, or more in resistance) in the transistor may not cause failure of the transistor but may slow down the transistor or device to unacceptable or undesirable levels. If a semiconductor device has multiple PFET transistors that are designed to operate in connection with each other, having even one PFET transistor with high gate series resistance can slow down the semiconductor device to unacceptable levels regardless of the total number of PFET transistors (even on the order of hundreds or thousands of PFET transistors on a single device).

A potential cause for the high gate series resistance may be a lack of doping near the interface between the gate layer (e.g., the polysilicon layer) and the gate stack layer (e.g., the metal stack and dielectric layer) in the PFET transistor. The lack of doping near the interface may be caused by insufficient diffusion of the dopant during annealing of the gate layer, especially for polysilicon gate layers formed from amorphous silicon implanted with dopants. The lack of doping at the interface between the gate layer and the gate stack layer may form a Schottky diode at the interface. The Schottky diode at the interface may increase resistance at the interface and slow down operation of the PFET transistor (e.g., slow down turning on of the PFET transistor).

SUMMARY

In certain embodiments, a semiconductor device includes a field effect transistor (FET) (e.g., a p-type doped transistor or a PFET transistor (a PMOS FET)). The PFET transistor may include a poly(silicon) layer with a p-type doped (e.g., boron doped) portion above a channel region of the transistor and an n-type doped (e.g., arsenic doped) end portion outside the channel region. The n-type doped end portion may be doped at the same time as the poly layers in NFET transistors (NMOS FETs) in the semiconductor device. The poly layer of the PFET transistor may be formed by selectively doping (e.g., doping the poly layer portions with either p-type dopant or n-type dopant) and then annealing an amorphous silicon layer. Annealing the amorphous silicon layer may crystallize the amorphous silicon to form polysilicon. The n-type doped end portion of the poly layer may reduce the effect of any Schottky diode formed at an interface between the p-type doped portion of the poly layer and an underlying gate stack (e.g. metal stack and dielectric layer).

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which.

Figure 1:
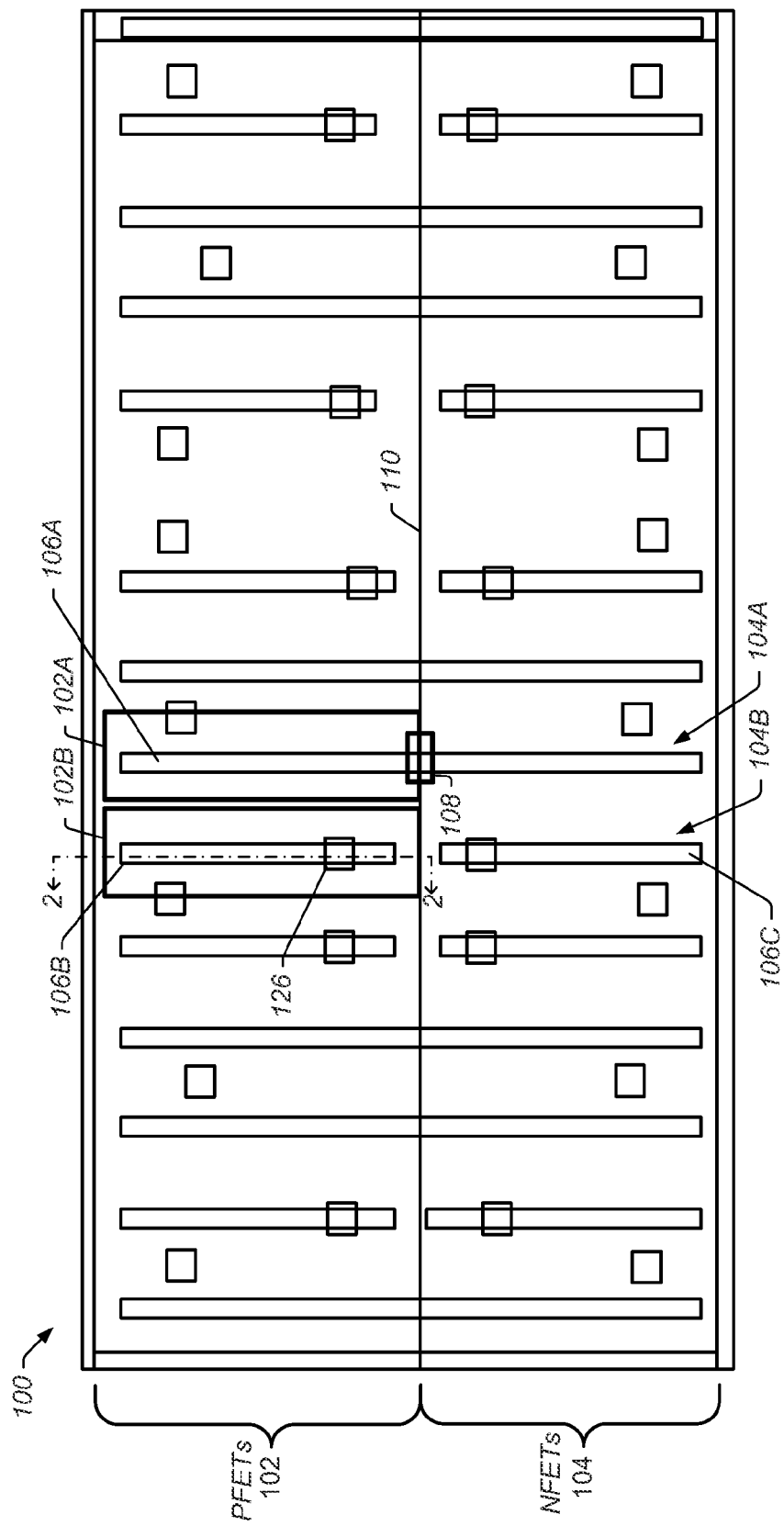
FIG. 1 depicts a top-view representation of an embodiment of a semiconductor device with a row of PFET transistors (top row) and a row of NFET transistors (bottom row).

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

In certain embodiments, a PFET transistor (a PMOS field effect transistor) is one of several PFET transistors on a semiconductor device. The semiconductor device may include one or more NFET transistors (NMOS field effect transistors) in addition to the one or more PFET transistors. In some embodiments, the PFET transistors and the NFET transistors are neighboring or adjacent on the semiconductor device. FIG. 1 depicts a top-view representation of an embodiment of semiconductor device 100 with a row of PFET transistors 102 (top row) and a row of NFET transistors 104 (bottom row).

In some embodiments, poly(silicon) layers (e.g., gate layers) and their underlying gate stacks (e.g., metal and dielectric stacks) extend across semiconductor device 100 between the row of PFET transistors 102 and the row of NFET transistors 104 without a break in the poly layers or the gate stacks. For example, PFET transistor 102A, shown in FIG. 1, has poly layer 106A (and its underlying gate stack structure) that extends into the row of NFET transistors 104 (e.g., the PFET transistor has a long poly layer).

In certain embodiments, transition 108 defines the transition between PFET transistor 102A and NFET transistor 104A along long poly layer 106A. Transition 108 may be formed by mask line 110. Mask line 110 may define areas in a mask pattern used for dopant deposition (implantation) into the poly layers on semiconductor device 100. For example, a mask may be used to block areas below mask line 110 during p-type dopant deposition into the poly layers (e.g., a blocked NMOS mask) while another mask may be used to block areas above mask line 110 during n-type dopant deposition into the poly layers (e.g., a blocked PMOS mask). Thus, poly layers above mask line 110 are doped with p-type dopant (e.g., boron) to form PFET transistors 102 above the mask line while poly layers below the mask line are doped with n-type dopant (e.g., arsenic) to form NFET transistors 104 below the mask line (e.g., the PFET transistors and the NFET transistors are doped with complementary dopants).

As shown in FIG. 1, there is a gap between PFET transistor 102B (e.g., a short poly PFET transistor) and NFET transistor 104B (e.g., a short poly NFET transistor). PFET transistor 102B and NFET transistor 104B have their own poly layers 106B, 106C, respectively. As shown in FIG. 1, poly layers 106B and 106C do not intersect. Thus, mask line 110 does not intersect the poly layer in short poly PFET transistor 102B or the poly layer in short poly NFET transistor 104B.

Figure 2:
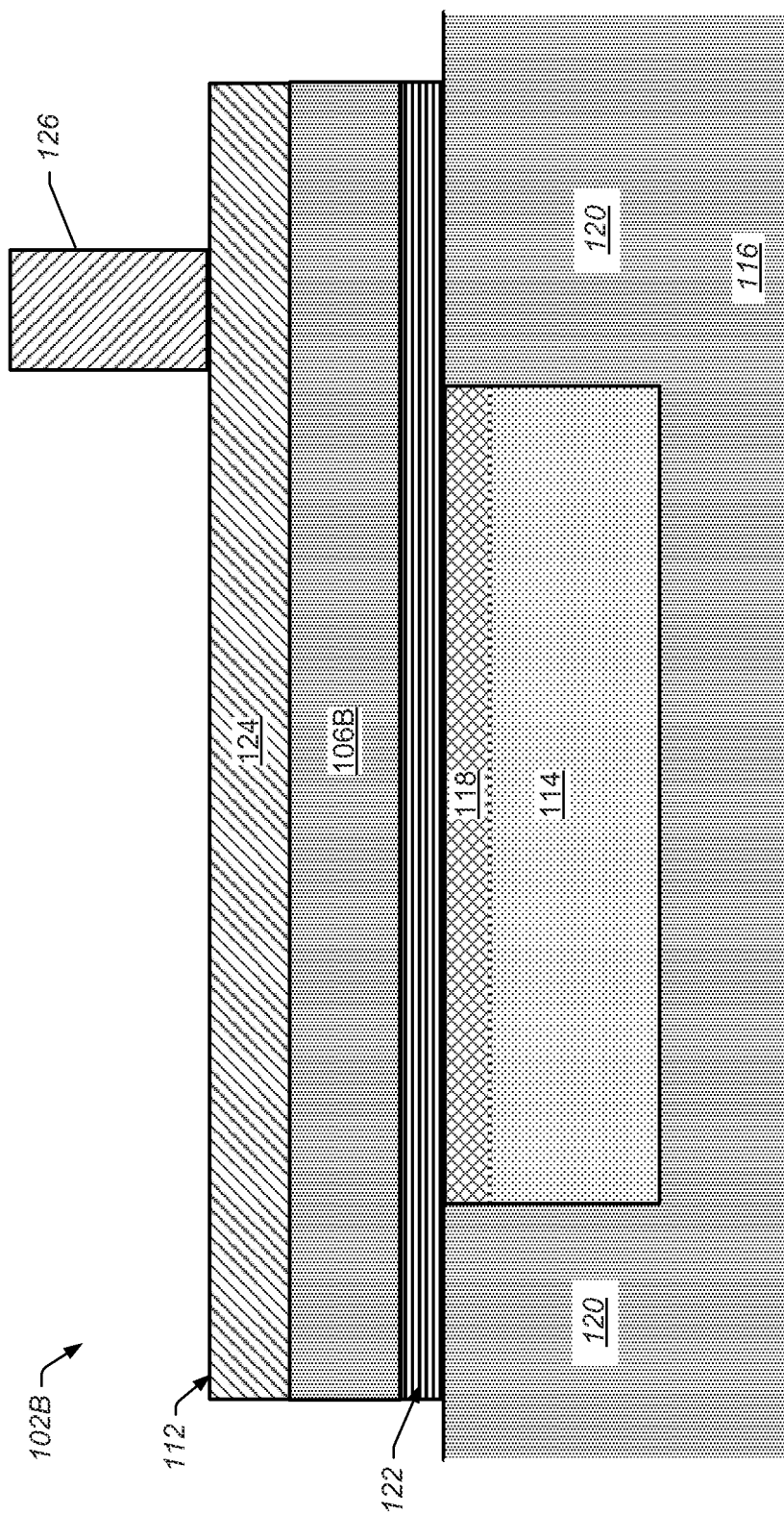
FIG. 2 depicts a cross-sectional representation of a short poly PFET transistor along the section line shown in FIG. 1.

FIG. 2 depicts a cross-sectional representation of short poly PFET transistor 102B along the section line shown in FIG. 1. PFET transistor 102B includes gate 112 formed above n-well region 114 in substrate 116. N-well region 114 may be, for example, a well region doped with n-type dopant (e.g., an active region). Substrate 116 may be, for example, a Si or SiGe substrate. Substrate 116 may include non-active regions 120 outside n-well region 114. In certain embodiments, channel region 118 is formed at the surface of n-well region 114. Channel region 118 may be, for example, a SiGe channel region. Gate 112 includes poly layer 106B above gate stack 122. In certain embodiments, gate stack 122 is a stack of metal and high-k dielectric material. In certain embodiments, silicide 124 (e.g., metal silicide such as NiSi) and gate contact 126 are formed above poly layer 106B.

PFET transistor 102B may be formed using a gate first HKMG (high-k metal gate) process. In certain embodiments, as shown in FIG. 2, gate stack 122 is a metal and high-k dielectric gate stack formed above channel region 118 in a PFET first process. In the PFET first process, $HfO_2$ (or other suitable high-k dielectric material) is deposited over the semiconductor device followed by deposition of the TiN—Al—TiN stack layers (or other suitable metal gate layers). Following deposition of the TiN—Al—TiN stack layers, a mask pattern is used to remove the TiN—Al—TiN layers in defined areas above NFET transistors 104, shown in FIG. 1. For example, a mask line along substantially the same line as mask line 110, shown in FIG. 1, may define the areas above NFETs transistors 104 for removal of the TiN—Al—TiN layers (e.g., the mask line defines the areas for NFET gate stack deposition). After removal of the TiN—Al—TiN in the defined areas, La and TiN (or other suitable metal gate layers) are deposited over the semiconductor device to form the $HfO_2$—La—TiN gate stack structures for gate stacks in NFET transistors 104. Because the TiN—Al—TiN layers are still present in the gate stacks of PFET transistors 102, the La and TiN layers are deposited on top of the TiN—Al—TiN layers in the gate stacks of PFET transistors 102 and the PFET transistors' gate stacks have a $HfO_2$—TiN—Al—TiN—La—TiN gate stack structure. The La—TiN top layers may have no function in PFET transistors 102. Although an embodiment for the PFET first process is described, it is to be understood that an NFET first process may also be used to form the gate stacks.

After formation of the gate stacks for both PFET transistors 102 and NFET transistors 104, a polysilicon layer (or other suitable conductive gate layer) may be deposited over semiconductor device 100, shown in FIG. 1. The polysilicon layer may be patterned to form, for example, poly layers 106A, 106B, 106C for PFET transistors 102 and NFET transistors 104. Following patterning of the poly layers, the poly layers may be selectively doped with either p-type dopant or n-type dopant as described above to form complementary doped poly layers for PFET transistors 102 and NFET transistors 104.

In certain embodiments, the poly layers are deposited as amorphous silicon that is then crystallized to form polysilicon. For example, poly layer 106B may first be deposited as an amorphous silicon layer over gate stack 122, as shown in FIG. 2. The amorphous silicon layer may then be heated (e.g., annealed) during further processing and crystallize into a polysilicon layer. Typically, amorphous silicon needs to be heated to temperatures above about 575° C. to crystallize into polysilicon. During certain processes used to form PFET transistor 102B, however, the crystallization of the amorphous silicon layer may not take place until after doping of the amorphous silicon layer. For example, poly layer 106B (deposited as amorphous silicon) may be doped with p-type dopant (e.g., boron) before any heating steps take place that would heat the amorphous silicon to crystallization temperatures.

In certain embodiments, the amorphous silicon layer (e.g., poly layer 106B) is doped with p-type dopant (e.g., boron) using an ion implantation process followed by annealing for diffusion of the dopant. For example, one or more ion implantations may be used to implant boron (B) and/or boron fluoride ($BF_2$) with high energy (e.g., 8 keV or higher) followed by annealing of the device to diffuse the boron and distribute the boron in poly layer 106B to desired levels.

Because the annealing process for the boron typically heats the device to temperatures above the crystallization temperature for amorphous silicon, the amorphous silicon may crystallize simultaneously while B and/or $BF_2$ diffuse. In some cases, the simultaneous crystallization of amorphous silicon may inhibit diffusion of B and/or $BF_2$ in poly layer 106B. Thus, B and/or $BF_2$ may be inhibited from reaching the interface of poly layer 106B and gate stack 122 and produce a lack of boron at or near the interface. The lack of boron at the interface of poly layer 106B and gate stack 122 may produce a "parasitic" Schottky diode effect at the interface (e.g., the interface between polysilicon in the poly layer and TiN in the gate stack without boron near the interface in the polysilicon may produce a Schottky diode at the interface). The Schottky diode may cause high gate series resistance (e.g., on the order of 1 MΩ, 10 MΩ, or more in resistance) in PFET transistor 102B. While the high gate series resistance in PFET transistor 102B may not cause failure of the transistor, the high resistance may slow down operation of the transistor to unacceptable or undesirable speeds. Slow down of one or more of the short poly PFET transistors (e.g., PFET transistors 102B) on semiconductor device 100 may produce yield penalty and cost issues associated with producing the semiconductor device.

Figure 3:
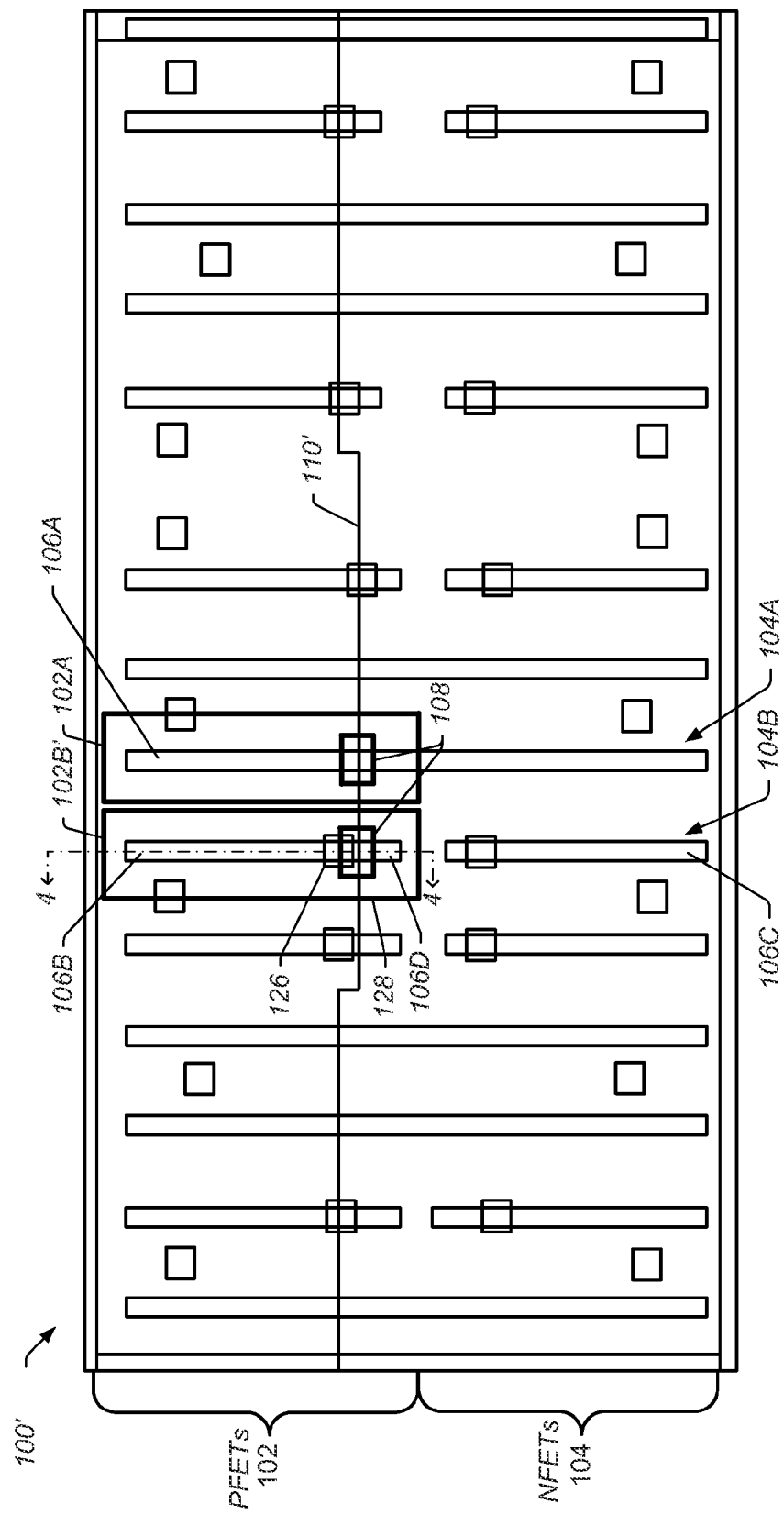
FIG. 3 depicts a top-view representation of another embodiment of a semiconductor device with rows of PFET transistors (top row) and NFET transistors (bottom row).
Figure 4:
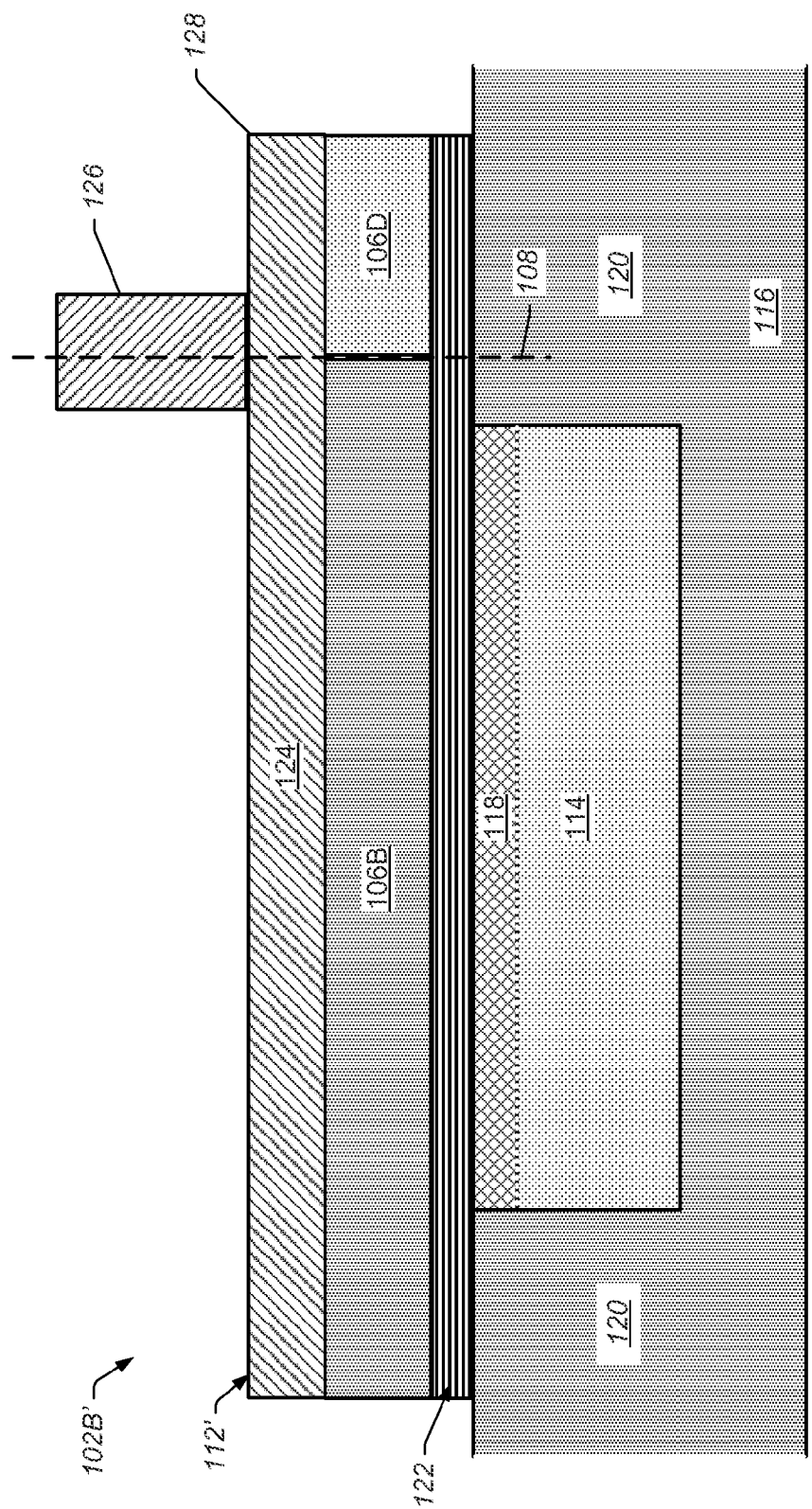
FIG. 4 depicts a cross-sectional representation of a short poly PFET transistor along the section line shown in FIG. 3.

To reduce the effect of a Schottky diode at the interface between poly layer 106B and gate stack 122, an electrical shunt may be provided in an end portion of the poly layer. The electrical shunt may short the Schottky diode and improve performance of the semiconductor device. FIG. 3 depicts a top-view representation of an embodiment of semiconductor device 100' with end portion 128 in short poly PFET transistor 102B'. End portion 128 may include poly layer 106D doped with a complementary dopant to poly layer 106B. FIG. 4 depicts a cross-sectional representation of short poly PFET transistor 102B' along the section line shown in FIG. 3. PFET transistor 102B' is similar to PFET transistor 102B, depicted in FIGS. 1 and 2. PFET transistor 102B' includes gate 112' formed above n-well region 114 (e.g., a well region doped with n-type dopant) and channel region 118 (e.g., a SiGe channel region) in substrate 116. Gate 112' includes poly layer 106B above gate stack 122 and channel region 118.

As described above, gate stack 122 may be formed above channel region 118 in the PFET first process by depositing $HfO_2$ over semiconductor device 100', depositing the TiN—Al—TiN stack layers, patterning and removing defined areas of the TiN—Al—TiN layers, and depositing La and TiN layers over the semiconductor device. In certain embodiments, after gate stack 122 is formed above channel region 118, an amorphous silicon layer is deposited on the gate stack. The amorphous silicon layer will form polysilicon layers 106B and 106D after doping and annealing.

Following deposition of the amorphous silicon layers on semiconductor device 100', the amorphous silicon layers are selectively doped using mask line 110' to define doping areas for either p-type dopant (e.g., boron) for PFET transistors 102 or n-type dopant (e.g., arsenic) for NFET transistors 104. As shown in FIG. 3, mask line 110', used to define the areas for selective dopant deposition (e.g., implantation of either p-type dopant or n-type dopant), intersects a portion of the amorphous silicon layer in short poly PFET transistor 102B' and defines end portion 128 in the short poly PFET transistor at transition 108. Mask line 110' has been moved relative to mask line 110, shown in FIG. 1. Moving mask line 110' (and transition 108) to intersect the amorphous silicon layer in short poly PFET transistor 102B', as shown in FIG. 3, allows the portion of the amorphous silicon layer in end portion 128 to be doped with n-type dopant (e.g., arsenic) at the same time that the amorphous silicon layers in NFET resistors 104 are doped. Thus, end portion 128 and poly layer 106D are doped with a dopant that is complementary to the remaining portion of the amorphous silicon layer in short poly PFET 102B' (e.g., poly layer 106B). Thus, after crystallization of the amorphous silicon layer (e.g., crystallization during annealing to diffuse one or more of the dopants), poly layer 106B is doped with p-type dopant (e.g., boron) and poly layer 106D in end portion 128 is doped with n-type dopant (e.g., arsenic).

In certain embodiments, p-type dopant is doped first, followed by n-type dopant, and then annealing to diffuse both dopants. It is to be understood, however, that the order of dopant implantation and/or annealing may be varied. For example, in some embodiments, n-type dopant implantation may be first, followed by p-type dopant implantation and annealing. Another variation may include annealing between dopant implantation steps. For example, p-type dopant may be implanted first, followed by annealing, followed by n-type dopant implantation, and then a final annealing. The final annealing after the second dopant implantation may or may not be needed depending on the doping process used and/or the desired final properties of the second dopant implantation.

While the above description refers to a single, short poly PFET 102B' with end portion 128 defined by mask line 110'. It is to be understood that, as shown in FIG. 3, other short poly PFETs may have end portions similarly defined by mask line 110' and these end portions may be doped with a complementary dopant (e.g., n-type dopant). Thus, semiconductor device 100'may include a plurality of short poly PFETs with complementary doped (n-type doped) end portions.

As shown in FIG. 4, transition 108 is located above non-active region 120 in substrate 116 (e.g., outside the active region formed by n-well region 114 and channel region 118 in the substrate). Thus, end portion 128 and poly layer 106D are located above a portion of substrate 116 outside n-well region 114 and channel region 118 in substrate 116 (e.g., the end portion and poly layer 106D are above a part of PFET transistor 102B' outside the channel region (non-active region 120)). Poly layer 106D may be located away from channel region 118 to inhibit the n-type dopant in the poly layer from affecting the channel region and/or operation of PFET transistor 102B'. For example, poly layer 106D may be located a horizontal distance of at least about 50 nm from channel region 118, at least about 60 nm from channel region 118, or at least about 75 nm from channel region 118. In certain embodiments, poly layer 106D is located a horizontal distance of at least about 56 nm from channel region 118.

In certain embodiments, poly layer 106B has a width of at least about 0.25 microns, at least about 0.4 microns, or at least about 0.5 microns. Poly layer 106D may, however, have a relatively small width compared to poly layer 106B. In certain embodiments, poly layer 106D has a width between about 40 nm and about 50 nm.

After annealing to diffuse the dopants, silicide 124 and gate contact 126 are formed above poly layers 106B and 106D. Gate contact 126 may be electrically coupled to poly layer 106B and poly layer 106D through silicide 124. In some embodiments, gate contact 126 is located at or near transition 108. Thus, at least a portion of gate contact 126 may be above poly layer 106D, as shown in FIG. 4.

As discussed above, boron (or $BF_2$) diffusion may be inhibited during the annealing process by the simultaneous crystallization of amorphous silicon and inhibit boron from reaching the interface of poly layer 106B and gate stack 122. Diffusion of n-type dopant (e.g., arsenic) in poly layer 106D, however, is less affected (inhibited) by the crystallization of the amorphous silicon. Thus, n-type dopant in poly layer 106D diffuses more thoroughly throughout the poly layer and reaches the interface of poly layer 106D and gate stack 122 in sufficient levels to avoid Schottky diode type effects or other high resistance effects at the interface.

The thorough diffusion of n-type dopant in poly layer 106D provides a current path between gate contact 126 and gate stack 122 through the poly layer (and through silicide 124) should a "parasitic" Schottky diode form at the interface between poly layer 106B and the gate stack. Gate stack 122 is electrically conductive by virtue of its metal stack. Thus, poly layer 106D may act as an electrical shunt to short the Schottky diode (e.g., poly layer 106D provides a current path between gate contact 126 and gate stack 122 that bypasses the Schottky diode). Providing complementary doped poly layer 106D in end portion 128 of PFET transistor 102B' may produce a solution to potential electrical problems in the PFET transistor that is easily integratable into current and/or future process flows used to form PFET transistors, NFET transistors, and/or similar MOS technologies. For example, the formation of complementary doped poly layer 106D is easily integrated into an existing process by moving the mask line for blocked PMOS and/or blocked NMOS masks (e.g., moving the mask line in only 1 or 2 masks). The electrical shunt provided by poly layer 106D may reduce the gate series resistance to acceptable levels if the Schottky diode at the interface between poly layer 106B and gate stack 122 occurs and reduce or eliminate problems with high gate series resistance (such as slow transistor operation). Providing complementary doped poly layer 106D in end portion 128 of PFET transistor 102B' may produce better yields (reduce yield penalties) on a semiconductor device and/or in multiple semiconductor device process flows.

While moving the mask line to the location of mask line 110' also changes the location of transition 108 between long poly PFET transistor 102A and long poly NFET transistor 104A, such a change may not adversely affect the operation of semiconductor device 100'. As described above, mask line 110' is used for both the blocked PMOS mask and the blocked NMOS mask. In some embodiments, however, it may be possible to use mask line 110, shown in FIG. 1, for the p-type dopant implantation step (e.g., the blocked NMOS mask uses mask line 110) while mask line 110', shown in FIG. 3, is used for the n-type dopant implantation step (e.g., the blocked PMOS mask uses mask line 110'). In such embodiments, portions of PFET transistors 102 (both short poly and long poly) would have both n-type dopant and p-type dopant (e.g., end portion 128 of PFET transistor 102B' and a transition section between PFET transistor 102A and NFET transistor 104A would include both n-type dopant and p-type dopant). The transition section between PFET transistor 102A and NFET transistor 104A may not adversely affect the operation of semiconductor device 100'. In addition, end portion 128 with both n-type dopant and p-type dopant may still operate as an electrical shunt as the n-type dopant (e.g., arsenic) present in the end portion thoroughly diffuses in poly layer 106D to provide a current path between gate contact 128 and gate stack 122 to overcome any Schottky diode effects at the interface between poly layer 106B and the gate stack.

Embodiments described herein describe a method for forming a complementary doped portion in a short poly PFET. It would be apparent to those skilled in the art, however, that the embodiments described herein may be applied to forming a substantially similar complementary doped portion in a short poly NFET, if desired.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A semiconductor device, comprising:
   a gate stack in a gate of a field effect transistor, wherein the gate stack is positioned above a channel region of the field effect transistor and above a part of the field effect transistor outside the channel region; and
   a polysilicon layer above the gate stack in the gate of the field effect transistor, the polysilicon layer comprising a first doped portion above the channel region of the field effect transistor and a second doped portion above the part of the field effect transistor outside the channel region, wherein both the first and second doped portions are in contact with the gate stack, wherein the first doped portion is doped with a first dopant type and the second doped portion is doped with a second dopant type that is complementary to the first dopant type, and wherein the second doped portion is located a selected distance away from the channel region, the selected distance selected such that the second doped portion has little to no affect on the operation of the field effect transistor.

2. The device of claim 1, wherein the second doped portion comprises an end portion of the polysilicon layer.

3. The device of claim 1, wherein the field effect transistor comprises a PFET.

4. The device of claim 1, wherein the first dopant type comprises p-type dopant and the second dopant type comprises n-type dopant.

5. The device of claim 1, wherein the gate stack comprises a high-k dielectric and a metal stack.

6. The device of claim 1, wherein the polysilicon layer comprises crystallized amorphous silicon.

7. The device of claim 1, further comprising a gate contact formed over the field effect transistor, wherein at least part of the gate contact is positioned above the first doped portion and at least part of the gate contact is positioned above the second doped portion, and wherein the first and second doped portions are electrically coupled to the gate contact.

8. The device of claim 7, wherein the second doped portion provides a current path from the gate stack to the gate contact when a high resistance exists between the first doped portion and the gate stack.

9. The device of claim 7, further comprising a silicide formed over the polysilicon layer, wherein the silicide electrically couples the first doped portion and the second doped portion to the gate contact.

10. A semiconductor device, comprising:
    a channel region in a semiconductor substrate;
    a gate stack above the channel region and above a part of the semiconductor substrate outside the channel region; and
    a doped polysilicon layer above the gate stack, wherein the doped polysilicon layer comprises a first doped portion above the channel region and a second doped portion above the part of the semiconductor substrate outside the channel region, the second doped portion being positioned above a non-active region of the semiconductor device, wherein both the first and second doped portions are in contact with the gate stack, and wherein the first doped portion is doped with a first dopant type and the second doped portion is doped with a second dopant type that is complementary to the first dopant type.

11. The device of claim 10, wherein the second doped portion is located outside an active region of the semiconductor device.

12. The device of claim 10, wherein the first doped portion comprises boron-doped polysilicon and the second doped portion comprises arsenic-doped polysilicon.

13. The device of claim 10, wherein the gate stack comprises an HfO$_2$—TiN—Al—TiN—La—TiN stack structure.

14. The device of claim 10, wherein the doped polysilicon layer comprises crystallized amorphous silicon.

15. The device of claim 10, wherein the channel region is in a well region of the semiconductor substrate.

16. A method for forming a semiconductor device, comprising:
    forming a gate stack in a gate of a field effect transistor, wherein the gate stack is positioned above a channel region of the field effect transistor and above a non-active region of the field effect transistor outside the channel region;
    forming a polysilicon layer on the gate stack in the gate of the field effect transistor;
    providing a first dopant to a first portion of the polysilicon layer above the channel region of the field effect transistor, wherein the first doped portion is in contact with the gate stack; and
    providing a second dopant to a second portion of the polysilicon layer above the non-active region of the field effect transistor outside the channel region, wherein the second doped portion is in contact with the gate stack, and wherein the second dopant is complementary to the first dopant.

17. The method of claim 16, wherein the polysilicon layer is formed by forming an amorphous silicon layer in the gate of the field effect transistor, and annealing the semiconductor device to crystallize the amorphous silicon layer.

18. The method of claim 16, wherein the gate stack comprises an $HfO_2$—TiN—Al—TiN—La—TiN stack structure.

19. A method for forming a semiconductor device, comprising:
   forming an amorphous silicon layer on a gate stack, wherein the gate stack has been formed above a channel region in a semiconductor substrate and above a part of the semiconductor substrate outside the channel region;
   providing a first dopant into a first portion of the amorphous silicon layer above the channel region, wherein the first portion is in contact with the gate stack;
   providing a second dopant into a second portion of the amorphous silicon layer above the part of the semiconductor substrate outside the channel region, wherein the second portion is in contact with the gate stack, and wherein the second doped portion is located a selected distance away from the channel region, the selected distance selected such that the second doped portion has little to no affect on the operation of the field effect transistor; and
   annealing the semiconductor device.

20. The method of claim 19, wherein the second doped portion comprises an end portion of the polysilicon layer.

21. The method of claim 19, further comprising crystallizing the amorphous silicon layer into a polysilicon layer when annealing the semiconductor device.

22. The method of claim 19, further comprising forming a gate contact above the part of the semiconductor substrate outside the channel region, wherein at least part of the gate contact is positioned above the first doped portion and at least part of the gate contact is positioned above the second doped portion, and wherein the first and second doped portions are electrically coupled to the gate contact.

23. A system, comprising:
   a semiconductor device comprising a plurality of first field effect transistors and a plurality of second field effect transistors, wherein the first field effect transistors comprise complementary doping to the second field effect transistors, and wherein the first and the second field effect transistors comprise gates with polysilicon layers formed on gate stacks;
   wherein a gate stack in at least one of the first field effect transistors is positioned above a channel region of the first field effect transistor and above a part of the first field effect transistor outside the channel region;
   wherein the polysilicon layer in the gate of the at least one first field effect transistor includes a first doped portion and a second doped portion, wherein the first doped portion is above the channel region of the first field effect transistor and the second doped portion is above the part of the first field effect transistor outside the channel region, wherein both the first and second doped portions are in contact with the gate stack, and wherein the first doped portion is doped with a first dopant type and the second doped portion is doped with a second dopant type that is complementary to the first dopant type; and
   wherein the first field effect transistor with the second doped portion comprises a short poly field effect transistor on the semiconductor device in which the field effect transistor comprises a polysilicon layer that is not shared with a neighboring complementary field effect transistor.

24. The device of claim 23, wherein the second doped portion comprises an end portion of the polysilicon layer.

25. The device of claim 23, wherein the first field effect transistors comprise PFETs and the second field effect transistors comprise NFETs.

26. The device of claim 23, wherein the polysilicon layers in the gates of the second field effect transistors are doped with the second dopant type.

* * * * *